United States Patent
Tsushima et al.

(10) Patent No.: US 9,250,524 B2
(45) Date of Patent: *Feb. 2, 2016

(54) POSITIVE WORKING LITHOGRAPHIC PRINTING PLATE PRECURSOR AND PROCESS FOR PREPARING LITHOGRAPHIC PRINTING PLATE

(71) Applicant: Eastman Kodak Company, Rochester, NY (US)

(72) Inventors: Motohiro Tsushima, Tatebayashi (JP); Yasuhiro Asawa, Ota (JP)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/357,640

(22) PCT Filed: Oct. 30, 2012

(86) PCT No.: PCT/JP2012/078554
§ 371 (c)(1),
(2) Date: May 12, 2014

(87) PCT Pub. No.: WO2013/094321
PCT Pub. Date: Jun. 27, 2013

(65) Prior Publication Data
US 2014/0349234 A1 Nov. 27, 2014

(30) Foreign Application Priority Data
Dec. 21, 2011 (JP) ................ 2011-280339

(51) Int. Cl.
*G03F 7/00* (2006.01)
*G03F 7/075* (2006.01)
*B41C 1/10* (2006.01)
*G03F 7/42* (2006.01)

(52) U.S. Cl.
CPC ............ *G03F 7/0758* (2013.01); *B41C 1/1008* (2013.01); *G03F 7/422* (2013.01); *B41C 1/1016* (2013.01); *B41C 2201/04* (2013.01); *B41C 2210/02* (2013.01); *B41C 2210/06* (2013.01); *B41C 2210/14* (2013.01); *B41C 2210/22* (2013.01); *B41C 2210/24* (2013.01); *B41C 2210/266* (2013.01)

(58) Field of Classification Search
USPC ............................................. 430/270.1, 302
See application file for complete search history.

(56) References Cited

U.S. PATENT DOCUMENTS

| 8,828,648 | B2 * | 9/2014 | Aoshima ................ 430/302 |
| 2010/0124721 | A1 | 5/2010 | Kitson et al. |
| 2011/0027505 | A1 * | 2/2011 | Majumdar et al. ....... 428/32.52 |

FOREIGN PATENT DOCUMENTS

| EP | 1 738 902 A1 | 1/2007 |
| EP | 1 903 396 A1 | 3/2008 |
| JP | 2011/170035 | 9/2011 |
| JP | 2011170035 A * | 9/2011 |

* cited by examiner

Primary Examiner — Chanceity Robinson
(74) Attorney, Agent, or Firm — J. Lanny Tucker

(57) ABSTRACT

The present invention relates to a positive working lithographic printing plate precursor, comprising:
(1) a substrate; and
(2) an imaging layer, formed on the substrate, comprising a water-insoluble and an alkaline aqueous solution-soluble or dispersible resin and a photo-thermal converting material,
wherein
the imaging layer comprises either polyurethane or polyurethane urea or both of the polyurethane and the polyurethane urea, the polyurethane and the polyurethane urea comprising a unit having a substituent having an acidic hydrogen atom and a unit having a polysiloxane moiety in a side or main chain. The present invention can provide a lithographic printing plate precursor which has high printing durability, good scratch resistance, and good developing properties, as well as enhanced ink receptivity.

16 Claims, No Drawings

POSITIVE WORKING LITHOGRAPHIC PRINTING PLATE PRECURSOR AND PROCESS FOR PREPARING LITHOGRAPHIC PRINTING PLATE

TECHNICAL FIELD

The present invention relates to a lithographic-printing plate precursor. More particularly, the present invention relates to an infrared-sensitive or heat-sensitive lithographic-printing plate precursor which is used as a so-called computer-to-plate (CTP) plate capable of directly recording images by irradiation with infrared rays from a solid laser or a semiconductor laser corresponding to digital signals, and a process for preparing a lithographic printing plate using the lithographic-printing plate precursor.

BACKGROUND ART

With the progress of computer image processing techniques, a method of directing recording images on a photosensitive layer by irradiation corresponding to digital signals has recently been developed and thus an intense interest has been shown toward a computer-to-plate (CTP) system in which images are directly formed on a photosensitive lithographic printing plate, without outputting onto a silver salt mask film, by employing the method in a lithographic printing plate precursor. The CTP system, which uses a high-output laser having a maximum intensity within a near infrared or infrared range as a light source for the irradiation, has the following advantages: images having high resolution can be obtained by exposure within a short time and the photosensitive lithographic printing plate precursor used in the system can be handled in daylight. Regarding solid and semiconductor lasers capable of emitting infrared rays having a wavelength of 760 to 1,200 nm, a high-output and portable laser is available with ease.

Also, as a lithographic printing plate precursor which can form images using a solid laser or semiconductor laser, JP-A-2007-17913 proposes a lithographic-printing plate precursor comprising a substrate, a first image recording layer and a second image recording layer formed on the substrate, wherein the second image recording layer comprises a specific polyurethane so as to prevent scratching of the surface of the lithographic printing plate precursor.

On the other hand, JP-A-2011-170035 proposes a lithographic printing plate precursor comprising a bottom layer comprising a water-insoluble and alkaline-soluble resin and an IR absorber, and a top layer comprising a water-insoluble and alkaline-soluble polyurethane resin and a polyorganosiloxane.

DISCLOSURE OF INVENTION

The lithographic printing plate precursor proposed in JP-A-2007-17913 may have high printing durability, good scratch resistance and good developing properties with an alkali developer with a pH of 11 or less, but further improvement in terms of ink receptivity may be required.

The lithographic printing plate precursor proposed in JP-A-2011-170035 may enhance developing properties by adding a polyorganosiloxane to the top layer, but the polyorganosiloxane may elute out from the top layer when developing, so that some requirements for lithographic printing plates such as ink receptivity may be deteriorated.

The present invention was completed in view of the above circumstances, and is for the purpose of providing a lithographic printing plate precursor which has high printing durability, good scratch resistance, and good developing properties, as well as enhanced ink receptivity.

The above objective of the present invention can be achieved by:

a positive working lithographic printing plate precursor, comprising:
(1) a substrate; and
(2) an imaging layer, formed on the substrate, comprising a water-insoluble and an alkaline aqueous solution-soluble or dispersible resin and a photo-thermal converting material,
wherein
the imaging layer comprises either polyurethane or polyurethane urea or both of the polyurethane and the polyurethane urea, the polyurethane and the polyurethane urea comprising a unit having a substituent having an acidic hydrogen atom and a unit having a polysiloxane moiety in a side or main chain, or a positive working lithographic printing plate precursor, comprising:
(1) a substrate;
(2) a bottom layer formed on the substrate; and
(3) a top layer formed on the bottom layer,
wherein
the (2) bottom layer and the (3) top layer comprise a water-insoluble and alkaline aqueous solution-soluble or dispersible resin;
either of the (2) bottom layer or the (3) top layer or both of the (2) bottom layer and the (3) top layer comprise(s) a photo-thermal converting material; and
the top layer (3) comprises either polyurethane or polyurethane urea or both of the polyurethane and the polyurethane urea, the polyurethane and the polyurethane urea comprising a unit having a substituent having an acidic hydrogen atom and a unit having a polysiloxane moiety in a side or main chain.

The polyurethane is obtainable from the of
at least one diisocyanate component, and
a diol component comprising a diol comprising a substituent having an acidic hydrogen atom and
a diol having a polysiloxane moiety in a side or main chain.

The polyurethane urea is obtainable from the reaction of at least one diisocyanate component, both the diol comprising a substituent having an acidic hydrogen atom or a diol having a polysiloxane moiety in a side or main chain, at least one diamine component.

The diamine component may be a diamine having a polysiloxane moiety in a main chain.

It is preferable that the substituent having an acidic hydrogen atom be selected from the group consisting of a carboxy group, —SO$_2$NHCOO—, —CONHSO$_2$—, —CONHSO$_2$NH—, and —NHCONHSO$_2$—.

It is preferable that the diol comprising a substituent having an acidic hydrogen atom be selected from the group consisting of 3,5-dihydroxybenzoic acid, 2,2-bis(hydroxymethyl) propionic acid, 2,2-bis(hydroxyethyl)propionic acid, 2,2-bis(3-hydroxypropyl)propionic acid, 2,2-bis(hydroxymethyl) acetic acid, bis-(4-hydroxyphenyl)acetic acid, 4,4-bis-(4-hydroxyphenyl)pentanoic acid and tartaric acid.

The amount of the diol comprising a substituent having an acidic hydrogen atom may be 50 to 95% by weight relative to the total weight of the diol component.

It is preferable that the diol having a polysiloxane moiety in a side or main chain have no silicon atom-bonded hydroxy group.

It is preferable that the diol having a polysiloxane moiety in a main chain be a both terminal hydroxy-modified diorganopolysiloxane which has at both terminals a group represented by the formula:

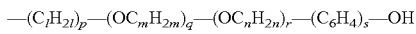

wherein l, m and n each independently denotes an integer from 1 to 3, p is an integer of 1 or more, q is an integer of from 0 to 100, r is an integer of from 0 to 100, and s is an integer of from 0 to 3.

It is preferable that the diol having a polysiloxane moiety in a side chain be a one terminal diol-modified diorganopolysiloxane represented by the formula:

wherein $R^1$ independently denotes a $C_1$-$C_{20}$ alkyl group, a $C_6$-$C_{20}$ aryl group or a $C_7$-$C_{20}$ aralkyl group;

$R^2$ denotes $-(C_lH_{2l})_u-(OC_mH_{2m})_v-(OC_nH_{2n})_w-(C_6H_4)_x-CR^1R^3_2$ wherein l, m, n and $R^1$ are as defined above, u is an integer of 1 or more, v is an integer of from 0 to 100, w is an integer of from 0 to 100, x is an integer of from 0 to 3, and $R^3$ independently denotes $-(C_yH_{2y})_zOH$ where y is an integer of from 1 to 3 and z is an integer of from 1 to 100; and t is an integer of from 1 to 10,000.

The amount of the diol having a polysiloxane moiety in a side or main chain may be 1 to 70% by weight relative to the total weight of the diol component.

The acid value of either polyurethane or polyurethane urea or both of the polyurethane and the polyurethane urea (hereafter, referred to as "polyurethane and/or polyurethane urea") may be 50 to 200 mgKOH/g. The weight average molecular weight of the polyurethane and/or polyurethane urea may be 2,000 to 100,000.

The amount of polyurethane and/or polyurethane urea may be from 10 to 99% by weight relative to the total weight of the imaging layer or the top layer.

The present invention also relates a process for preparing a lithographic printing plate, comprising the steps of:

imagewise exposing any of the above positive working lithographic printing plate precursors; and developing the exposed positive working lithographic printing plate precursor with an alkaline developer to remove the exposed region in order to form imaging and non-imaging regions.

It is preferable that the step of imagewise exposing be performed by using an IR laser.

The pH of the alkaline developer may be 12 or less.

The lithographic printing plate precursor according to the present invention can have high printing durability and good scratch resistance. Further, it can also have broad developing latitude even for a developer with a pH of 11 or less so that it can have good developing properties. Furthermore, it can have enhanced ink receptivity. In addition, the lithographic printing plate precursor according to the present invention with a plurality of layers can cause a lesser amount of deposits in a developer, because the top layer can dissolve or disperse in the developer.

The process for preparing a lithographic printing plate according to the present invention can provide a lithographic printing plate which has high printing durability, good scratch resistance, good developing properties and enhanced ink receptivity by a simple method. In addition, the process is preferable in terms of environmental or safety reasons, because it can use an aqueous solution which is closer to the neutral region, as an alkaline developer for developing.

BEST MODE FOR CARRYING OUT THE INVENTION

<First Mode>

The first mode of the lithographic printing plate precursor according to the present invention is a positive working lithographic printing plate precursor, comprising:

(1) a substrate; and (2) an imaging layer, formed on the substrate, comprising a water-insoluble and an alkaline aqueous solution-soluble or dispersible resin and a photo-thermal converting material, wherein the imaging layer comprises either polyurethane or polyurethane urea or both of the polyurethane and the polyurethane urea, the polyurethane and the polyurethane urea comprising a unit having a substituent having an acidic hydrogen atom and a unit having a polysiloxane moiety in a side or main chain.

The imaging layer of the positive working lithographic printing plate precursor according to the first mode of the present invention includes at least one water-insoluble and an alkaline aqueous solution-soluble or dispersible resin. In order to enable the resin to be soluble or dispersible in the alkaline aqueous solution, the resin preferably has at least one functional group such as hydroxyl group, carboxyl group, sulfonic acid group, phosphoric acid group, imide group and amide group. Therefore, the resin, which is water-insoluble but soluble or dispersible in the aqueous alkali solution, can be preferably produced by polymerizing a monomer mixture containing at least one ethylenically unsaturated monomer having a functional group selected from the group consisting of hydroxyl group, carboxyl group, sulfonic acid group, phosphoric acid group, imide group, amide group, and a combination thereof.

The ethylenically unsaturated monomer may be a compound represented by the following formula:

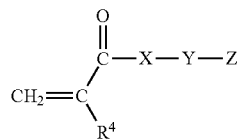

wherein $R^4$ represents a hydrogen atom, a $C_{1-22}$ linear, branched or cyclic alkyl group, a $C_{1-22}$ linear, branched or cyclic substituted alkyl group, or a $C_{6-24}$ aryl or substituted aryl group, the substituent being selected from a $C_{1-4}$ alkyl group, an aryl group, a halogen atom, a keto group, an ester group, an alkoxy group and a cyano group;

X represents O, S or $NR^5$, where $R^5$ represents hydrogen, a $C_{1-22}$ linear, branched or cyclic alkyl group, a $C_{1-22}$ linear, branched or cyclic substituted alkyl group or a $C_{6-24}$ aryl group or substituted aryl group, the substituent being selected from a $C_{1-4}$ alkyl group, an aryl group, a halogen atom, a keto group, an ester group, an alkoxy group and a cyano group;

Y represents a single bond, or a $C_{1-22}$ linear, branched or cyclic alkylene, alkyleneoxyalkylene, poly(alkyleneoxy) alkylene or alkylene-NHCONH—;

Z represents a hydrogen atom, a hydroxy group, carboxylic acid, —C$_6$H$_4$—SO$_2$NH$_2$, —C$_6$H$_3$—SO$_2$NH$_2$(—OH), or a group represented by the following formula:

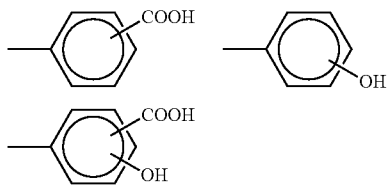

or a mixture thereof.

Examples of the ethylenically unsaturated monomer include, in addition to acrylic acid and methacrylic acid, compounds represented by the following formulas and a mixture thereof.

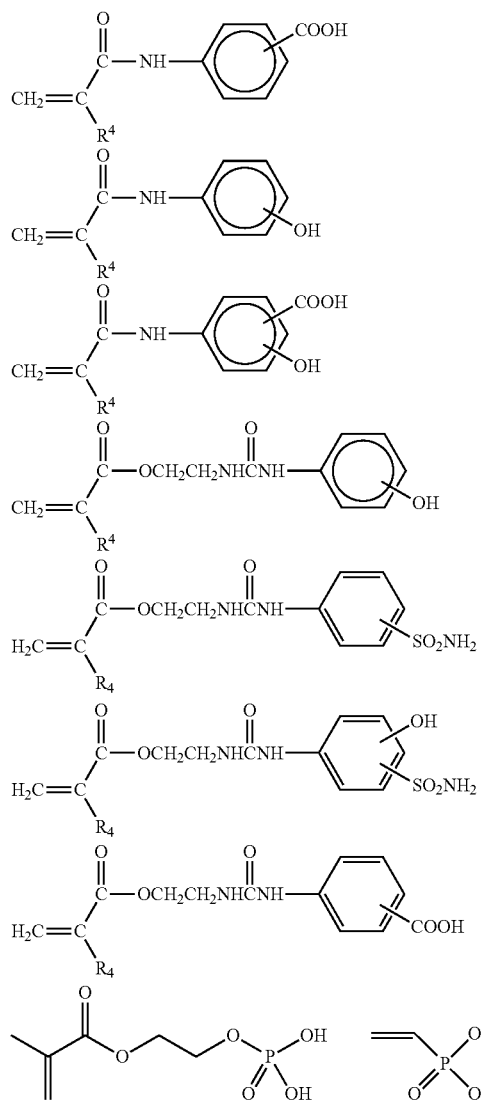

Ethylene glycol methacrylate phosphate ("Phosmer-M", manufactured by Uni-Chemical Co., Ltd.)

Vinyl phosphonic acid

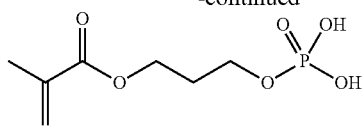

1,3-propylene glycol methacrylate phosphate

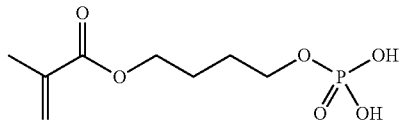

1,4-n-butylene glycol methacrylate phosphate

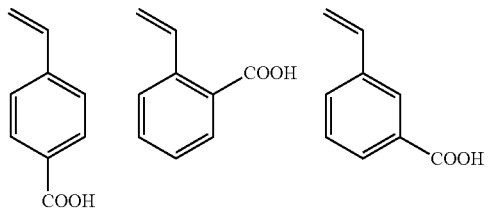

The monomer mixture may contain another ethylenically unsaturated comonomer. Examples of another ethylenically unsaturated comonomer include the following monomers:

acrylate esters such as methyl acrylate, ethyl acrylate, propyl acrylate, butyl acrylate, amyl acrylate, ethylhexyl acrylate, octyl acrylate, t-octyl acrylate, chloroethyl acrylate, 2,2-dimethylhydroxypropyl acrylate, 5-hydroxypentyl acrylate, trimethylolpropane monoacrylate, pentaerythritol monoacrylate, glycidyl acrylate, benzyl acrylate, methoxybenzyl acrylate and tetrahydroacrylate;

aryl acrylates such as phenyl acrylate and furfuryl acrylate;

methacrylate esters such as methyl methacrylate, ethyl methacrylate, propyl methacrylate, isopropyl methacrylate, allyl methacrylate, amyl methacrylate, hexyl methacrylate, cyclohexyl methacrylate, benzyl methacrylate, chlorobenzyl methacrylate, octyl methacrylate, 4-hydroxybutyl methacrylate, 5-hydroxypentyl methacrylate, 2,2-dimethyl-3-hydroxypropyl methacrylate, trimethylolpropane monomethacrylate, pentaerythritol monomethacrylate, glycidyl methacrylate, furfuryl methacrylate and tetrahydrofurfuryl methacrylate;

aryl methacrylates such as pheny methacrylate, cresyl methacrylate and naphthyl methacrylate;

N-alkylacrylamides such as N-methylacrylamide, N-ethylacrylamide, N-propylacrylamide, N-butylacrylamide, N-t-butylacrylamide, N-heptylacrylamide, N-octylacrylamide, N-cyclohexylacrylamide and N-benzylacrylamide;

N-arylacrylamides such as N-phenylacrylamide, N-tolylacrylamide, N-nitrophenylacrylamide, N-naphthylacrylamide and N-hydroxyphenylacrylamide;

N,N-dialkylacrylamides such as N,N-dimethylacrylamide, N,N-diethylacrylamide, N,N-dibutylacrylamide, N,N-dibutylacrylamide, N,N-diisobutylacrylamide, N,N-diethylhexylacrylamide and N,N-dicyclohexylacrylamide;

N,N-arylacrylamides such as N-methyl-N-phenylacrylamide, N-hydroxyethyl-N-methylacrylamide and N-2-acetamideethyl-N-acetylacrylamide;

N-alkylmethacrylamides such as N-methylmethacrylamide, N-ethylmethacrylamide, N-propylmethacrylamide, N-butylmethacrylamide, N-t-butylmethacrylamide, N-ethylhexylmethacrylamide, N-hydroxyethylmethacrylamide and N-cyclohexylmethacrylamide;

N-arylmethacrylamides such as N-phenylmethacrylamide and N-naphthylmethacrylamide;

N,N-dialkylmethacrylamides such as N,N-diethylmethacrylamide, N,N-dipropylmethacrylamide and N,N-dibutylmethacrylamide;

N,N-diarylmethacrylamides such as N,N-diphenylmethacrylamide;

methacrylamide derivatives such as N-hydroxyethyl-N-methylmethacrylamide, N-methyl-N-phenylmethacrylamide and N-ethyl-N-phenylmethacrylamide;

allyl compounds such as allyl acetate, allyl caproate, allyl caprylate, allyl laurate, allyl palmitate, allyl stearate, allyl benzoate, allyl acetoacetate, allyl lactate, and allyloxyethanol;

vinyl ethers such as hexyl vinyl ether, octyl vinyl ether, dodecyl vinyl ether, ethylhexyl vinyl ether, methoxyethyl vinyl ether, ethoxyethyl vinyl ether, chloroethyl vinyl ether, 1-methyl-2,2-dimethylpropyl vinyl ether, 2-ethylbutyl vinyl ether, hydroxyethyl vinyl ether, diethylene glycol vinyl ether, dimethylaminoethyl vinyl ether, diethylaminoethyl vinyl ether, butylaminoethyl vinyl ether, benzyl vinyl ether, tetrahydrofurfuryl vinyl ether, vinyl phenyl ether, vinyl tolyl ether, vinyl chlorophenyl ether, vinyl-2,4-dichlorophenyl ether, vinyl naphthyl ether and vinyl anthranyl ether;

vinylesters such as vinyl butyrate, vinyl isobutyrate, vinyltrimethyl acetate, vinyldiethyl acetate, vinyl valerate, vinyl caproate, vinylchloro acetate, vinylmethoxy acetate, vinylbutoxy acetate, vinylphenyl acetate, vinyl acetoacetate, vinyl lactate, vinyl-β-phenyl butyrate, vinylcyclohexyl carboxylate, vinyl benzoate, vinyl salicylate, vinyl chlorobenzoate, vinyl tetrachlorobenzoate and vinyl naphthoate;

styrenes such as styrene, methylstyrene, dimethylstyrene, trimethylstyrene, ethylstyrene, diethylstyrene, isopropylstyrene, butylstyrene, hexylstyrene, cyclohexylstyrene, dodecylstyrene, benzylstyrene, chloromethylstyrene, trifluoromethylstyrene, ethoxymethylstyrene, acetoxymethylstyrene, methoxystyrene, 4-methoxy-3-methylstyrene, dimethoxystyrene, chlorostyrene, dichlorostyrene, trichlorostyrene, tetrachlorostyrene, pentachlorostyrene, bromostyrene, dibromostyrene, iodostyrene, fluorostyrene, 2-bromo-4-trifluoromethylstyrene and 4-fluoro-3-trifluoromethylstyrene;

crotonate esters such as butyl crotonic crotonate, hexyl crotonate, crotonic acid and glycerin monocrotonate;

dialkyl itaconates such as dimethyl itaconate, diethyl itaconate and dibutyl itaconate;

dialkyls of maleic acid or fumaric acid, such as dimethyl fumarate and dibutyl fumarate;

maleimides such as N-methylmaleimide, N-ethylmaleimide, N-propylmaleimide, N-butylmaleimide, N-phenylmaleimide, N-2-methylphenylmaleimide, N-2,6-diethylphenylmaleimide, N-2-chlorophenylmaleimide, N-cyclohexylmaleimide, N-laurylmaleimide and N-hydroxyphenylmaleimide; and nitrogen atom-containing monomers such as N-vinyl pyrrolidone, N-vinylpyridine, acrylonitrile and methacrylonitrile.

Among these other ethylenically unsaturated comonomers, for example, (meth)acrylate esters, (meth)acrylamides, maleimides and (meth)acrylonitriles are preferably used.

The weight average molecular weight of the water-insoluble and alkaline aqueous solution-soluble or dispersible resin is preferably from 2,000 to 100,000, more preferably from 5,000 to 50,000 and further more preferably from 12,000 to 30,000. When the weight average molecular weight of the water-insoluble and alkaline aqueous solution-soluble or dispersible resin is less than 2,000, the solvent durability or abrasion resistance thereof may tend to be poor. On the other hand, when the weight average molecular weight of the water-insoluble and alkaline aqueous solution-soluble or dispersible resin is more than 100,000, alkaline developing properties thereof may tend to be poor.

The content of the water-insoluble and alkaline aqueous solution-soluble or dispersible resin is preferably within a range from 1 to 90% by weight, more preferably from 3 to 80% by weight, and further more preferably from 5 to 70% by weight, based on the total weight of the solid content in the imaging layer. If necessary, two or more kinds of the water-insoluble and alkaline aqueous solution-soluble or dispersible resins may be used in combination.

The imaging layer of the positive working lithographic printing plate precursor according to the first mode of the present invention includes at least one photo-thermal converting material. The photo-thermal converting material means any material capable of converting electromagnetic waves into thermal energy and is a material having a maximum absorption wavelength within the near infrared or infrared range, for example, a material having a maximum absorption wavelength within a range from 760 to 1,200 nm. Examples of such a substance include various pigments and dyes.

The pigments used in the present invention are commercially available pigments described, for example, in "Color Index Handbook", "Latest Pigment Handbook" (edited by Nihon Pigment Technique Society, published in 1977), "Latest Pigment Application Technique" (published by CMC in 1986), and "Printing Ink Technique" (published by CMC in 1984). Applicable types of pigments include black, yellow, orange, brown, red, violet, blue and green pigments, fluorescent pigments and polymer-grafted dyes. For example, there can be used insoluble azo pigments, azo lake pigments, condensed azo pigments, chelated azo pigments, phthalocyanine pigments, anthraquinone pigments, perylene and perinone pigments, thiomindigo pigments, guinacridone pigments, dioxazine pigments, isoindolinone pigments, quinophthalone pigments, lake pigments, azine pigments, nitroso pigments, nitro pigments, natural pigments, fluorescent pigments, inorganic pigments and carbon black.

Among these pigments, carbon black is preferably used as a material which efficiently absorbs light in the near infrared or infrared range and is also economically excellent. As the carbon black, grafted carbon blacks having various functional groups, which are excellent in dispersibility, are commercially available and examples thereof include those described on page 167 of "The Carbon Black, Handbook, 3rd edition" (edited by the Carbon Black Society of Japan and issued in 1995 and those described on page 111 of "Characteristics, Optimum Blending and Applied Technique of Carbon Black" (edited by Technical Information Society in 1997), all of which are preferably used in the present invention.

These pigments may be used without surface treatment, or may be used after being subjected to a surface treatment. As a method of surface treatment, there can be contemplated a method of surface-coating a resin or a wax, a method of attaching a surfactant, and a method of binding a reactive substance (e.g. silane coupling agent, epoxy compound, polyisocyanate etc.) to the surface of a pigment. The above-mentioned surface treating methods are described in "Property and Application of Metal Soap" (Saiwai Shobou), "Printing Ink Technique" (published by CMC in 1984) and "Latest Pigment Application Technique" (published by CMC in 1986). The particle size of these pigments is preferably within a range from 0.01 to 15 µm, and more preferably from 0.01 to 5 µm.

The dyes used in the present invention are conventionally known commercially available dyes described, for example, in "Dye Handbook" (edited by the Association of Organic Synthesis Chemistry, published in 1970), "Handbook of Color Material Engineering" (edited by the Japan Society of Color Material, Asakura Shoten K. K., published in 1989), "Technologies and Markets of Industrial Dyes" (published by CMC in 1983), and "Chemical Handbook, Applied Chemistry Edition" (edited by The Chemical Society of Japan, Maruzen Shoten K. K., published in 1986). Specific examples of the dyes include azo dyes, azo dyes in the form of metal complex salts, pyrazolone azo dyes, anthraquinone dyes, phthalocyanine dyes, carbonium dyes, quinonimine dyes, methine dyes, cyanine dyes, indigo dyes, quinoline dyes, nitro-based dyes, xanthene-based dyes, thiazine-based dyes, azine dyes, and oxazine dyes.

As the dyes capable of efficiently absorbing near infrared rays or infrared rays, for example, there can be used dyes such as azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salts and metal thiolate complexes (for example, nickel thioate complexes). Among these, cyanine dyes are preferable, and cyanine dyes represented by the general formula (I) of JP-A-2001-305722 and compounds described in paragraphs [0096] to [0103] of JP-A-2002-079772 can be exemplified.

The photothermal conversion materials are particularly preferably dyes represented by the following formulas:

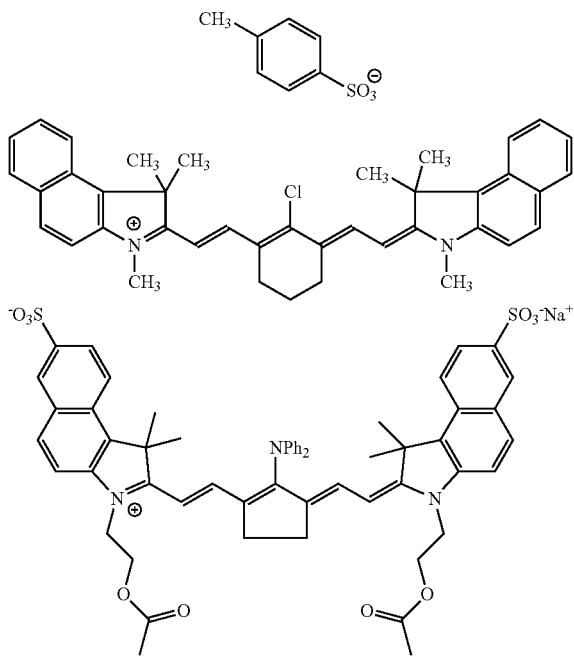

wherein Ph represents a phenyl group.

The photo-thermal converting material can be added in the imaging layer in an amount within the range from 0.001 to 20% by weight, preferably from 0.01 to 10% by weight, and particularly preferably from 0.1 to 5% by weight, based on the solid content of the imaging layer. When the amount is less than 0.001% by weight, sensitivity may decrease. On the other hand, when the amount is more than 20% by weight, the non-image area may be contaminated during printing. These photo-thermal converting materials may be used alone or in combination.

The imaging layer of the positive working lithographic printing plate precursor according to the first mode of the present invention includes at least one polyurethane and/or at least one polyurethane urea, comprising a unit having a substituent having an acidic hydrogen atom and a unit having a polysiloxane moiety in a side or main chain.

It is preferable that the substituent having an acidic hydrogen atom be selected from the group consisting of a carboxy group, —SO$_2$NHCOO—, —CONHSO$_2$—, —CONHSO$_2$NH—, and —NHCONHSO$_2$—, and a carboxy group is more preferable.

The polysiloxane moiety may have a linear, a partially branched linear, branched or cyclic structure, and is preferably a linear or a partially branched, and more preferably a linear structure. As the linear polysiloxane moiety, mention may be made of R$_3$SiO—(R$_2$SiO)$_i$—R$_2$Si—, R$_3$SiO—(R$_2$SiO)$_j$—R$_2$SiO— and the like, wherein R independently denotes a C$_{1-20}$ alkyl group, a C$_{6-20}$ aryl group or a C$_{7-20}$ aralkyl group; and i and j each independently denotes an integer from 1 to 10,000. As the C$_{1-20}$ alkyl group, mention may be made of a linear or branched alkyl group such as a methyl group, an ethyl group, a propyl group, a butyl group, a pentyl group, a hexyl group, a heptyl group, and an octyl group; a cycloalkyl group such as a cyclopentyl group and a cyclohexyl group; and a C$_{1-20}$ alkyl group in which the hydrogen atom(s) bonded to the carbon atom(s) of the above is/are at least partially replaced with halogen atom(s) such as fluorine atom(s) or organic group(s) including a hydroxy group, an epoxy group, a glycidyl group, an acyl group, a carboxyl group, an amino group, a methacryl group, a mercapto group or the like. As the C$_{6-20}$ aryl group, mention may be made of a phenyl group, a tolyl group, a xylyl group, a mesityl group and a C$_{6-20}$ aryl group in which the hydrogen atom(s) bonded to the carbon atom(s) thereof is/are at least partially replaced with halogen atom(s) such as fluorine atom(s) or organic group(s) including a hydroxy group, an epoxy group, a gly- cidyl group, an acyl group, a carboxyl group, an amino group, a methacryl group, a mercapto group or the like. As the C$_{7-20}$ aralkyl group, mention may be made of a benzyl group, a phenethyl group and a C$_{7-20}$ aralkyl group in which the hydrogen atom(s) bonded to the carbon atom(s) thereof is/are at least partially replaced with halogen atom(s) such as fluorine atom(s) or organic group(s) including a hydroxy group, an epoxy group, a glycidyl group, an acyl group, a carboxyl group, an amino group, a methacryl group, a mercapto group or the like.

The polyurethane comprising a unit having a substituent having an acidic hydrogen atom and a unit having a polysiloxane moiety in a side or main chain can be obtained from the reaction of at least one diisocyanate component, and a diol component comprising a diol comprising a substituent having an acidic hydrogen atom and a diol having a polysiloxane moiety in a side or main chain.

The polyurethane urea comprising a unit having a substituent having an acidic hydrogen atom and a unit having a polysiloxane moiety in a side or main chain can be obtained from the reaction of at least one diisocyanate component, a diol component comprising either a diol comprising a substituent having an acidic hydrogen atom or a diol having a polysiloxane moiety in a side or main chain or both the diol comprising a substituent having an acidic hydrogen atom and the diol having a polysiloxane moiety in a side or main chain, and at least one diamine component.

The molar ratio of the diisocyanate component to (the diol component or the diol component+the diamine component) is preferably from 0.7:1 to 1.5:1. When an isocyanate group remains at the end of the polymer, it is possible to synthesize by treating with alcohols or amines so that an isocyanate group does not finally remain.

The diisocyanate component is not limited as long as it has two isocyanate groups. Examples of the diisocyanate component include 4,4'-diphenylmethane diisocyanate, xylylene diisocyanate, naphthylene-1,5-diisocyanate, tetramethylxylene diisocyanate, hexamethylene diisocyanate, toluene-2,4-diisocyanate, toluene-2,6-diisocyanate, isophorone diisocyanate, hydrogenated xylylene diisocyanate, dicyclohexylmethane diisocyanate, norbornene diisocyanate and trimethylhexamethylene diisocyanate and dimer acid diisocyanate.

The diol comprising a substituent having an acidic hydrogen atom is not limited as long as it has the substituent having an acidic hydrogen atom. It is preferable that the diol have a group selected from the group consisting of a carboxy group, —$SO_2NHCOO$—, —$CONHSO_2$—, —$CONHSO_2NH$—, and —$NHCONHSO_2$—, and more preferably it have a carboxy group.

As a dial having a carboxy group, mention may be made of 3,5-dihydroxybenzoic acid, 2,2-bis(hydroxymethyl)propionic acid, 2,2-bis(hydroxyethyl)propionic acid, 2,2-bis(3-hydroxypropylpropionic acid, 2,2-bis(hydroxymethyl)acetic acid, bis-(4-hydroxyphenyl)acetic acid, 4,4-bis-(4-hydroxyphenyl)pentanoic acid and tartaric acid. In particular, 2,2-bis(hydroxymethyl)propionic acid is preferable in terms of reactivity with isocyanate.

The amount of the dial comprising a substituent having an acidic hydrogen atom is preferably from 50 to 95% by weight, more preferably 55 to 90% by weight, and further more preferably 60 to 85% by weight, relative to the total weight of the diol component.

The diol having a polysiloxane moiety in a side or main chain is not limited as long as it has the above polysiloxane moiety, and it is preferable that it have no silicon atom-bonded hydroxy group.

As the diol having a polysiloxane moiety in a main chain, a both terminal hydroxy-modified diorganopolysiloxane which has at both terminals a group represented by the formula:

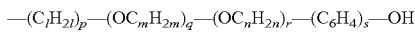

wherein l, m and n each independently denotes an integer of from 1 to 3, p is an integer of 1 or more, preferably an integer of from 1 to 3, and more preferably 1 or 2, q is an integer of from 0 to 100, preferably an integer of from 0 to 50, and more preferably an integer of from 0 to 30, r is an integer of from 0 to 100, preferably an integer of from 0 to 50, and more preferably an integer of from 0 to 30, and s is an integer of from 0 to 3, preferably an integer of from 0 to 2, and more preferably 0 or 1, is preferable.

As the both terminal hydroxy-modified diorganopolysiloxane, mention may be made of X-22-160AS, KF-6001, KF-6002, KF-6003, X-22-4272, X-22-4952, X-22-6266, X-22-1821 and X-22-1824B, manufactured by Shin Etsu Chemical Co., Ltd.

As the diol having a polysiloxane moiety in a side chain, a one terminal diol-modified diorganopolysiloxane represented by the formula:

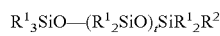

wherein $R^1$ independently denotes a $C_1$-$C_{20}$ alkyl group, a $C_6$-$C_{20}$ aryl group or a $C_7$-$C_{20}$ aralkyl group;

$R^2$ denotes —$(C_lH_{2l})_u$—$(OC_mH_{2m})_v$—$(OC_nH_{2n})_w$—$(C_6H_4)_x$—$CR^1R^3{}_2$ wherein l, m, n and $R^1$ are as defined above, u is an integer of 1 or more, preferably an integer of from 1 to 3, and more preferably 1 or 2, v is an integer of from 0 to 100, preferably an integer of from 0 to 50, and more preferably an integer of from 0 to 30, w is an integer of from 0 to 100, preferably an integer of from 0 to 50, and more preferably an integer of from 0 to 30, preferably v+w=1, x is an integer of from 0 to 3, preferably 0 or 1, and more preferably 0, $R^3$ independently denotes —$(C_yH_{2y})_z$OH where y is an integer of from 1 to 3, preferably 1 or 2, and z is an integer of from 1 to 100, preferably 1 to 30, and more preferably 1 or 2; and t is an integer of from 1 to 10,000, preferably an integer of from 10 to 10,000, and more preferably an integer from 100 to 10,000, is preferable.

As the one terminal hydroxy-modified diorganopolysiloxane, mention may be made of X-22-176DX, and X-22-176F, manufactured by Shin Etsu Chemical Co., Ltd.

The diol component may contain other diols. Other diols include dimethylolpropane, polypropylene glycol, neopentyl glycol, 1,3-propanediol, polytetramethylene ether glycol, polyesterpolyol, polymerpolyol, polycaprolactonepolyol, polycarbonatediol, 1,4-butanediol, 1,5-pentadiol, 3-methyl-1,5-pentadiol, 1,6-hexanediol, polybutadienepolyol and 1,4-dihydroxymethylbenzene.

The amount of the diol having a polysiloxane moiety in a side or main chain is preferably from 1 to 30% by weight, more preferably 2 to 20% by weight, and further more preferably 3 to 15% by weight, relative to the total weight of the diol component. The OH value of the diol having a polysiloxane moiety in a side or main chain is preferably from 20 to 100 mgKOH/g, more preferably 25 to 80 mgKOH/g, and further more preferably 30 to 70 mgKOH/g.

The diamine component is not limited as long as it has two amine groups. For example, mentiona may be made of p-xylenediamine, p-phenylenediamine, m-phenylenediamine, 4,4'-diaminodiphenylpropane, 4,4'-diaminodiphenylmethane, 4,4'-diaminodiphenylether, 4,4'-diaminodiphenylsulfone, 3,3'-dimethyl-4,4'-diaminodiphenylmethane, 4,4'-diaminodiphenyl, 1,5-diaminonaphthaline, 1,4-diaminoanthraquinone, 2,6-diaminoanthraquinone, o-anisidine, 2,6-aminopyridine, 4,6-diamino-2-mercaptopyridine, and 1,6-diaminohexane.

As the diamine component, a diamine having a polysiloxane moiety in the main chain may be used. As the diamine having a polysiloxane moiety in the main chain, a both terminal amino-modified diorganopolysiloxane which has at both terminals a group represented by the formula:

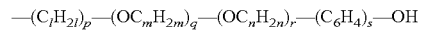

wherein l, m, n, p, q, r and s are as defined above, is preferable. If the diol component does not include a diol having a polysiloxane moiety in a side or main chain, it is preferable to use a diamine having a polysiloxane moiety in the main chain.

As the both terminal amino-modified diorganopolysiloxane, mention may be made of KF-8010, KF-8012, X-22-161A, and X-22-161B, manufactured by Shin Etsu Chemical Co., Ltd.

The weight average molecular weight of the polyurethane and/or polyurethane urea, comprising a unit having a substituent having an acidic hydrogen atom and a unit having a polysiloxane moiety in a side or main chain, is preferably 2,000 to 100,000, more preferably 5,000 to 50,000, and further more preferably 12,000 to 30,000. When the weight average molecular weight is less than 2,000, the imaged area formed by imaging may be weak, and may tend to have poor ink receptivity. On the other hand, when the weight average molecular weight exceeds over 100,000, sensitivity may be poor.

The acid value of the polyurethane and/or polyurethane urea may be 50 to 200 mgKOH/g, preferably 60 to 150 mgKOH/g and more preferably 70 to 100 mgKOH/g.

The polyurethane and/or polyurethane urea, comprising a unit having a substituent having an acidic hydrogen atom and a unit having a polysiloxane moiety in a side or main chain, may preferably be water-insoluble and alkaline aqueous solution-soluble or dispersible. In this case, the imaging layer may comprise, as a resin component, only the polyurethane and/or polyurethane urea, comprising a unit having a substituent having an acidic hydrogen atom and a unit having a polysiloxane moiety in a side or main chain.

The amount of polyurethane and/or polyurethane urea, comprising a unit having a substituent having an acidic hydrogen atom and a unit having a polysiloxane moiety in a side or main chain, may be from 10 to 99% by weight, preferably 30 to 99% by weight, and more preferably 50 to 99% by weight, relative to the total weight of the imaging layer (solid content). If necessary, two or more polyurethanes and/or polyurethane ureas, comprising a unit having a substituent having an acidic hydrogen atom and a unit having a polysiloxane moiety in a side or main chain, may be used together.

<Second Mode>

The second mode of the lithographic printing plate precursor according to the present invention is a positive working lithographic printing plate precursor, comprising:
(1) a substrate;
(2) a bottom layer formed on the substrate; and
(3) a top layer formed on the bottom layer,
wherein
the (2) bottom layer and the (3) top layer comprise a water-insoluble and alkaline aqueous solution-soluble or dispersible resin;
the (2) bottom layer and/or the (3) top layer comprise(s) a photo-thermal converting material; and the top layer (3) comprises polyurethane and/or polyurethane urea, comprising a unit having a substituent having an acidic hydrogen atom and a unit having a polysiloxane moiety in a side or main chain.

The second mode of the lithographic printing plate precursor according to the present invention is a multi-layer type lithographic printing plate precursor having at least two layers of a bottom layer and a top layer. The multi-layer type lithographic printing plate precursor may comprise an additional layer other than the bottom layer and the top layer. For example, an intermediate layer may be provided between the bottom layer and the top layer. However, it is preferable that the intermediate layer be present between the bottom layer and the top layer.

According to the second mode of the lithographic printing plate precursor according to the present invention, both of the bottom layer and the top layer comprises at least one water-insoluble and alkaline aqueous solution-soluble or dispersible resin, and the bottom layer and/or the top layer comprises at least one photo-thermal converting material. It is preferable that both of the bottom layer and the top layer comprise at least one photo-thermal converting material.

The meaning and the like of "water-insoluble and alkaline aqueous solution-soluble or dispersible resin", "photo-thermal converting material" and "polyurethane and/or polyurethane urea comprising a unit having a substituent having an acidic hydrogen atom and a unit having a polysiloxane moiety in a side or main chain" are as defined above.

The amount of water-insoluble and alkaline aqueous solution-soluble or dispersible resin may be from 1 to 90% by weight, preferably 3 to 80% by weight, and more preferably 5 to 70% by weight, for the bottom or top layer each, relative to the total weight of the bottom or top layer (solid content). If necessary, two or more water-insoluble and alkaline aqueous solution-soluble or dispersible resins may be used together.

The amount of photo-thermal converting material may be from 0.001 to 20% by weight, preferably 0.01 to 10% by weight, and more preferably 0.1 to 5% by weight, for the bottom or top layer each, relative to the total weight of the bottom or top layer (solid content). If necessary, two or more photo-thermal converting materials may be used together.

The amount of polyurethane and/or polyurethane urea, comprising a unit having a substituent having an acidic hydrogen atom and a unit having a polysiloxane moiety in a side or main chain, may be from 10 to 99% by weight, preferably 30 to 99% by weight, and more preferably 50 to 99% by weight, relative to the total weight of the top layer (solid content). If necessary, two or more polyurethanes and/or polyurethane ureas, comprising a unit having a substituent having an acidic hydrogen atom and a unit having a polysiloxane moiety in a side or main chain, may be used together.

The polyurethane and/or polyurethane urea, comprising a unit having a substituent having an acidic hydrogen atom and a unit having a polysiloxane moiety in a side or main chain, may preferably be water-insoluble and alkaline aqueous solution-soluble or dispersible. In this case, the top layer may comprise, as a resin component, only the polyurethane and/or polyurethane urea, comprising a unit having a substituent having an acidic hydrogen atom and a unit having a polysiloxane moiety in a side or main chain.

<Substrate>

For the positive working lithographic printing plate precursor of the first and second modes of the present invention, as the substrate, mention may be made of metal plates made of aluminum, zinc, copper, stainless steel, and iron; plastic films made of polyethylene terephthalate, polycarbonate, polyvinyl acetal, polyethylene, etc.; composite materials obtained by forming a metal layer on papers, plastic films which are melt-coated or coated with a synthetic resin solution, using technologies such as vacuum deposition and laminating; and a material used as the substrate of the printing plate. It is particularly preferred to use a substrate made of aluminum or a composite substrate coated with aluminum. The backside of the substrate may, if necessary, have a back-coating layer.

It is preferred that the surface of the aluminum substrate is surface-treated for the purpose of enhancing water retentivity and improving adhesion with an imaging layer or an optionally formed intermediate layer. Examples of the surface treatment include roughening treatments such as a brush graining method, a ball graining method, electrolytic etching, chemical etching, liquid honing, and sandblasting, and a combination thereof. Among these, a roughening treatment including use of electrolytic etching is particularly preferred.

As an electrolytic bath in the case of electrolytic etching, for example, an aqueous solution containing an acid, an alkali or a salt thereof, or an aqueous solution containing an organic solvent is used. Among these, an electrolytic solution containing hydrochloric acid, nitric acid, or a salt thereof is particularly preferred.

Furthermore, the aluminum substrate subjected to the roughening treatment is subjected to a desmutting treatment using an aqueous solution of an acid or an alkali, if necessary. It is preferred that the aluminum substrate thus obtained is subjected to an anodic oxidation treatment. It is particularly preferred that the anodic oxidation treatment is performed using a bath containing sulfuric acid or phosphoric acid.

If necessary, the aluminum substrate can be subjected to a silicate treatment (for example, sodium silicate, potassium silicate), a potassium fluorozirconate treatment, a phosphomolybdate treatment, an alkyl titanate treatment, a polyacrylic acid treatment, a polyvinylsulfonic acid treatment, a polyvinylphosphonic acid treatment, a copolymer treatment with vinylphosphonic acid and (meth)acrylamide and/or (meth)acrylic acid, a phytic acid treatment, a treatment with a salt of a hydrophilic organic polymer compound and a divalent metal, a hydrophilization treatment by undercoating with a water soluble polymer having a sulfonic acid group, a coloring treatment with an acidic dye, and electrodeposition with silicate.

An aluminum substrate, which was subjected to a sealing treatment after subjecting to a roughening treatment (graining treatment) and an anodic oxidation treatment, is also preferred. The sealing treatment is performed by immersing an aluminum substrate in a hot aqueous solution containing hot water and an inorganic salt or an organic salt, or performed using a steam bath.

The lithographic printing plate precursor of the present invention is produced by dissolving or dispersing constituent components of an imaging layer in organic solvents, sequentially coating the resultant solutions or dispersions on a substrate, and drying the solution or dispersion to form an imaging layer on the substrate. The multi-layer type lithographic printing plate precursor of the present invention is preferably prepared by forming the bottom layer on the substrate and forming the top layer such that the top layer contacts with the bottom layer, in order to simplify preparation. Accordingly, in one embodiment, the multi-layer type lithographic printing plate precursor can be produced by coating a solution or dispersion prepared by constituent components of the bottom layer in an organic solvent on a substrate, and coating a solution or dispersion prepared by constituent components of the top layer in an organic solvent, followed by drying to form the bottom layer and the top layer on the substrate.

As the organic solvent in which constituent components of the imaging layer are dissolved or dispersed, conventionally known organic solvents can be used. In view of an advantage upon drying, an organic solvent having a boiling point within a range from 40 to 200° C., especially 60 to 160° C. is selected.

Examples of the organic solvent include alcohols such as methyl alcohol, ethyl alcohol, n- or iso-propyl alcohol, n- or iso-butyl alcohol, and diacetone alcohol; ketones such as acetone, methyl ethyl ketone, methyl propyl ketone, methyl butyl ketone, methyl amyl ketone, methyl hexyl ketone, diethyl ketone, diisobutyl ketone, cyclohexanone, methylcyclohexanone, and acetylacetone; hydrocarbons such as hexane, cyclohexane, heptane, octane, nonane, decane, benzene, toluene, xylene, and methoxybenzene; acetate esters such as ethyl acetate, n- or iso-propyl acetate, n- or iso-butyl acetate, ethylbutyl acetate, and hexyl acetate; halides such as methylene dichloride, ethylene dichloride, and monochlorobenzene; ethers such as isopropyl ether, n-butyl ether, dioxane, dimethyldioxane, and tetrahydrofuran; polyhydric alcohols such as ethylene glycol, ethylene glycol monomethyl ether, ethylene glycol monomethyl ether acetate, ethylene glycol monoethyl ether, ethylene glycol monoethyl ether acetate, ethylene glycol monobutyl ether, ethylene glycol monobutyl ether acetate, ethylene glycol dimethyl ether, ethylene glycol diethyl ether, ethylene glycol dibutyl ether, methoxyethoxyethanol, diethylene glycol monomethyl ether, diethylene glycol dimethyl ether, diethylene glycol methylethyl ether, diethylene glycol diethyl ether, propylene glycol, propylene glycol monomethyl ether, propylene glycol monomethyl ether acetate, propylene glycol monoethyl ether, propylene glycol monoethyl ether acetate, propylene glycol monobutyl ether, 3-methyl-3-methoxybutanol, and 1-methoxy-2-propanol, and derivatives thereof; and special solvents such as dimethyl sulfoxide, N,N-dimethylformamide, methyl lactate, ethyl lactate and γ-butyrolactone. These organic solvents are used alone or in combination. The solid content of the solution or dispersion to be coated is preferably from 2 to 50% by weight. The solid content as used herein means components excluding the organic solvent and moisture.

As the method of coating the solutions or dispersions of constituent components of the imaging layer, for example, methods such as roll coating, dip coating, air knife coating, gravure coating, gravure offset coating, hopper coating, blade coating, wire doctor coating, spray coating, and die coating methods can be used. The coating amount is preferably within a range from 10 to 100 ml/m$^2$.

The solution or dispersion coated on the substrate is usually dried by heated air. The drying temperature (temperature of hot air) is preferably within a range from 30 to 200° C., and particularly from 40 to 140° C. The solution or dispersion can also be dried by not only a method of maintaining the drying temperature at a given temperature during drying, but also a method of stepwise raising the drying temperature.

Preferred results may be sometimes obtained by dehumidifying the drying air. The drying air is preferably supplied to the surface to be coated at a wind velocity within a range from 0.1 to 30 m/sec, and particularly preferably from 0.5 to 20 m/sec.

The coating amount of the imaging layer is usually within a range from about 0.5 to about 5 g/m$^2$ in terms of dry mass. In the case of a multi-layer type, each coating amount of the bottom layer and the top layer is usually within a range from about 0.1 to about 5 g/m$^2$.

After drying the imaging layer, the lithographic printing plate precursor can be further "conditioned" with a heat treatment at from about 40 to about 90° C. for at least 4 hours (for example, at least 20 hours) under conditions that inhibit the removal of moisture from the dried imaging layer. For example, the heat treatment is carried out at from about 50 to about 70° C. for at least 24 hours. During the heat treatment, the lithographic printing plate precursor is wrapped or encased in a water-impermeable sheet material to represent an effective barrier to moisture removal from the precursor, or the heat treatment of the precursor is carried out in an environment in which relative humidity is controlled to at least 25%. In addition, the water-impermeable sheet material can be sealed around the edges of the precursor, with the water-impermeable sheet material being a polymeric film or metal foil that is sealed around the edges of the precursor.

In some embodiments, this heat treatment can be carried out with a stack comprising at least 100 of the same lithographic printing plate precursors, or when the precursor is in the form of a coil or web. While being conditioned in a stack, the individual precursors may be separated by suitable interleaving papers. Such papers are available from several commercial sources. The interleaving papers may be kept between the precursors after conditioning during packing and shipping and until they are used by the customer.

<Other Constituent Components of Imaging Layer>

To the imaging layer of the lithographic printing plate precursor (including the multi-layer type) of the present invention, if necessary, known additives such as colorants (dyes, pigments), surfactants, plasticizers, stability modifiers, development accelerators, development restrainers and lubricants (silicone powder) can be added.

Examples of preferable dyes include basic oil-soluble dyes such as Crystal Violet, Malachite Green, Victoria Blue, Methylene Blue, Ethyl Violet and Rhodamine B. Examples of commercially available dyes include "Victoria Pure Blue BOH" [manufactured by HODOGAYA CHEMICAL Co., Ltd.], "Oil Blue #603" [manufactured by Orient Chemical Industries, LTD.], "VPB-Naps (naphthalenesulfonate of Victoria Pure Blue)" [manufactured by HODOGAYA CHEMICAL Co., Ltd.] and "D11" [manufactured by PCAS Co.]; and pigments such as Phthalocyanine Blue, Phthalocyanine Green, Dioxadine Violet and Quinacridone Red.

Examples of surfactants include fluorine-based surfactants and silicone-based surfactants.

Examples of plasticizers include diethyl phthalate, dibutyl phthalate, dioctyl phthalate, tributyl phosphate, trioctyl phosphate, tricresyl phosphate, tri(2-chloroethyl) phosphate and tributyl citrate.

As the stabilizer, for example, phosphoric acid, phosphorous acid, oxalic acid, tartaric acid, malic acid, citric acid, dipicolinic acid, polyacrylic acid, benzenesulfonic acid and toluenesulfonic acid can be used in combination.

Examples of other stability modifiers include known phenolic compounds, quinones, N-oxide compounds, amine-based compounds, sulfide group-containing compounds, nitro group-containing compounds and transition metal compounds. Specific examples thereof include hydroquinone, p-methoxyphenol, p-cresol, pyrogallol, t-butylcatechol, benzoquinone, 4,4'-thiobis(3-methyl-6-t-butylphenol), 2,2'-methylenebis(4-methyl-6-t-butylphenol), 2-mercaptobenimidazole and N-nitrosoenylhydroxyamine primary cerium salts.

Examples of development accelerators include acid anhydrides, phenols and organic acids. The acid anhydrides are preferably cyclic anhydrides. For example, there can be used, as the cyclic acid anhydride, phthalic anhydride, tetrahydrophthalic anhydride, hexahydrophthalic anhydride, 3,6-endoxy-tetrahydrophthalic anhydride, tetrachlorophthalic anhydride, maleic anhydride, chloromaleic ahydride, α-phenyl maleic anhydride, succinic anhydride and pyromellitic anhydride described in the description of U.S. Pat. No. 4,115,128. Examples of the non-cyclic acid anhydride include acetic anhydride. Examples of phenols include bisphenol A, 2,2'-bishydroxysulfone, p-nitrophenol, p-ethoxyphenol, 2,4,4'-trihydroxybenzophenone, 2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Examples of organic acids include sulfonic acids, sulfonic acids, alkylsulfuric acids, phosphonic acids, phosphate esters and carboxylic acids described in JP-A-S60-88942 and JP-A-H02-96755, and specific examples thereof include p-toluenesulfonic acid, dodecylbenzenesulfonic acid, p-toluenesulfinic acid, ethylsulfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-dimethylaminobenzoic acid, 4-cyclohexene-1,2-dicarboxylic acid, erucic acid, lauric acid, n-undecanoic acid and ascorbic acid.

The development restrainer is not specifically limited as far as it interacts with the alkali-soluble resin and substantially reduces solubility in a developing solution of the alkali-soluble resin in the non-exposed area and also makes the exposed area soluble in the developing solution as a result of a weakened interaction, and quaternary ammonium salts and polyethylene glycol-based compounds are preferably used. Among the above-described infrared absorbers and colorants, compounds capable of functioning as the development restrainer are present and are preferably exemplified. There can also be exemplified substances, which are pyrolytic and substantially deteriorate solubility of the alkali-soluble resin in the non-decomposed state, such as onium salts, o-quinonediazide compounds, aromatic sulfone compounds and aromatic sulfonate ester compounds.

The amount of these various additives vary depending on the purpose, but is preferably within a range from 0 to 30% by weight based on the solid content of the imaging layer. In the case of the multi-layer type, the amount of these various additives is preferably within a range from 0 to 30% by weight relative to the total solid content of the bottom and upper layers.

In the imaging layer of the lithographic printing plate precursor of the present invention, other alkali-soluble or dispersible resins may be used in combination, if necessary. Examples of the other alkali-soluble or dispersible resins include copolymers of alkali-soluble group-containing monomers such as acrylic acid, methacrylic acid, maleic acid, maleic anhydride, itaconic acid and itaconic anhydride and the other monomer(s), polyester resin and acetal resin.

The lithographic printing plate precursor of the present invention may contain a matting agent in the top layer for the purpose of improving interleaving paper peelability and plate transportation properties of an automatic plate feeding apparatus, or a matting layer may be formed on the top layer.

<Exposure and Development>

The infrared-sensitive or heat-sensitive lithographic printing plate precursor of the present invention can be used as a so-called computer-to-plate (CTP) plate capable of directly recording images on a plate using a laser based on digital image information from a computer.

As a light source of the laser in the present invention, a high-output laser having a maximum intensity within the near infrared or infrared range is used most preferably. Examples of the high-output laser having a maximum intensity within the near infrared or infrared range include various lasers having a maximum intensity within the near infrared or infrared range of 760 to 1,200 nm, for example, semiconductors and YAG lasers.

The lithographic printing plate precursor of the present invention is provided for an image forming method comprising recording images on the imaging layer using a laser, followed by a development treatment and further removal of the non-image area using a wet method. That is, the process for preparing a lithographic printing plate of the present invention prepares a lithographic printing plate, by imagewise exposing the positive working lithographic printing plate precursor according to the present invention; and developing the exposed positive working lithographic printing plate precursor with an alkaline developer to remove the exposed region in order to form imaging and non-imaging regions.

Examples of the developer used in a developing treatment include an aqueous alkali solution (aqueous basic solution). The pH of the aqueous alkali solution is preferably 12 or lower, and more preferably 11 or lower. Specifically, the pH is preferably from 6 to 11, more preferably from 8 to 11, and particularly preferably from 10 to 11.

Examples of the alkali agent used in the developer include inorganic alkali compounds such as sodium silicate, potassium silicate, potassium hydroxide, sodium hydroxide, lithium hydroxide, sodium, potassium or ammonium salts of secondary or tertiary phosphoric acid, sodium metasilicate, sodium carbonate, and ammonia; and organic alkali compounds such as monomethylamine, dimethylamine, trimethylamine, monoethylamine, diethylamine, triethylamine, monoisopropylamine, diisopropylamine, n-butylamine, di-n-butylamine, monoethanolamine, diethanolamine, triethanolamine, ethyleneimine and ethylenediamine. For the process for preparing a lithographic printing plate according to the present invention, a developer which comprises substantially no silicate is preferable.

The content of the alkali agent in the developer is preferably within a range from 0.005 to 10% by weight, and particularly preferably from 0.05 to 5% by weight. A content of the alkali agent in the developer of less than 0.005% by weight is not preferable because the development may not be conducted sufficiently. A content of more than 10% by weight is not preferable because an adverse influence such as corrosion of the image area may be exerted on development.

An organic solvent can also be added to the developer. Examples of the organic solvent, which can be added to the developing solution, include ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methylphenyl carbitol, n-amyl alcohol, methylamyl alcohol, xylene, methylene dichloride, ethylene dichloride and monochlorobenzene. When the organic solvent is added to the developer, the content of the organic solvent is preferably 20% by weight or less, and particularly preferably 10% by weight or less.

If necessary, it is also possible to add, in the developer, water soluble sulfites such as lithium sulfite, sodium sulfite, potassium sulfite and magnesium sulfite; hydroxyaromatic compounds such as alkali-soluble pyrazolone compounds, alkali-soluble thiol compounds and methyl resorcin; water softeners such as polyphosphate and aminopolycarboxylic acids; various surfactants, for example, anionic, cationic, amphoteric and fluorine-based surfactants such as sodium isopropylnaphthalenesulfonate, sodium n-butylnaphthalene sulfonate, sodium N-methyl-N-pentadecyl aminoacetate and sodium lauryl sulfate; and various defoamers.

As the developer, commercially available developing solutions for negative or positive type PS plates can be used. Specifically, a solution prepared by diluting a commercially available concentrated developing solution for negative or positive type PS plates 1 to 1,000 times can be used as the developer in the present invention.

The temperature of the developer is preferably within a range from 15 to 40° C. and the dipping time is preferably within a range from 1 second to 2 minutes. If necessary, the surface can be slightly rubbed during the development.

After the completion of the development treatment, the lithographic printing plate is preferably washed with water and/or subjected to a treatment with an aqueous desensitizing agent (finishing gum). Examples of the aqueous desensitizing agent include aqueous solutions of water-soluble natural polymers such as gum arabic, dextrin and carboxymethyl cellulose, and aqueous solutions of water-soluble synthetic polymers such as polyvinyl alcohol, polyvinyl pyrrolidone and polyacrylic acid. If necessary, acids or surfactants are added to these aqueous desensitizing agents. After being subjected to a treatment with the desensitizing agent, the lithographic printing plate is dried and then used for printing as a printing plate.

For the purpose of improving printing durability of the resulting lithographic printing plate, the lithographic printing plate may be subjected to a burning treatment after the developing treatment.

The burning treatment is carried out by the steps of (i) washing the lithographic printing plate with water and removing a rinsing solution or a gum solution, followed by squeegeeing, (ii) uniformly spreading a counter-etching solution over the entire plate, followed by drying, (iii) burning the plate in an oven under the temperature conditions of 180 to 300° C. for 1 to 30 minutes, and (iv) cooling the plate, washing the plate with water to remove the counter-etching solution, followed by gum coating and further drying.

According to the lithographic printing plate precursor of the present invention described above, positive images with high resolution can be provided using an infrared laser and the lithographic printing plate precursor is excellent in resistance to a solvent for washing UV inks and is also suited for UV ink-printing because the bottom layer itself has solvent resistance.

EXAMPLES

The present invention will be described in more detail by way of examples, which however should not be construed as limiting the scope of the present invention.

Synthesis Example 1

In a 500 ml three-necked round bottom flask equipped with a concentrator and a stirrer, 53.2 g of 4,4'-diphenylmethane diisocyanate, 8.3 g of 1,6-hexanediol, 19.1 g of 2,2-bis(hydroxymethyl)propionic acid, 19.2 g of silicone oil, both terminals of which are modified with —$C_3H_6OC_2H_4OH$ (KF-6001 marketed by Shin Etsu Chemical (diol having a polysiloxane moiety at the main chain): OH value=62 mg KOH/g, and viscosity=42 mm$^2$/s) and 300 g of N,N'-dimethyl acetamide were charged. After adding 0.3 g of dibutyltin didodecanoate, the reaction mixture was heated to 80° C. while stirring. The reaction was continued at 80° C. for 6 hours. After the reaction, the solution of the reaction mixture was poured into 2.5 liters of water. The deposit was filtered, washed and dried at 60° C. for 24 hours under vacuum. Thus, a polyurethane (1) was obtained. The weight average molecular weight (Mw) as determined by GPC (with standard polystyrene) was 22,000. The acid value (A.V.) was 80 mgKOH/g.

Synthesis Examples 2 to 12

In the same manner as in Synthesis Example 1, except that diisocyanates and diols (or diols+a diamine) shown in Table 1 were used, polyurethanes (2) to (13) were obtained.

TABLE 1

| No. | Diisocyanates | mol ratio | Diols | mol ratio |
|---|---|---|---|---|
| (2) | OCN—C6H4—CH2—C6H4—NCO (4,4'-MDI) | 0.80 mol | HOCH2—C(CH3)(COOH)—CH2OH | 0.69 mol |
| | 2,4-TDI (OCN-, -NCO, -CH3 on benzene ring) | 0.20 mol | HOCH2—C(CH3)(CH3)—CH2OH | 0.31 mol |
| | | | KF-6001 (Shin-Etsu Chemical, OH value = 62 mg KOH/g) (diol having a polysiloxane moiety at the main chain) | 0.05 mol |
| | Mol ratio of diisocyanate/diol = 1/1.05, Mw = 24,000, A.V. = 86 mg KOH/g | | | |
| (3) | OCN—C6H4—CH2—C6H4—NCO | 0.80 mol | HOCH2—C(CH3)(COOH)—CH2OH | 0.70 mol |
| | OCN—(CH2)6—NCO | 0.20 mol | HO—(CH2)6—OH | 0.29 mol |
| | | | KJ-6001 (Shin-Etsu Chemical, OH value = 62 mg KOH/g) (diol having a polysiloxane moiety at the main chain) | 0.11 mol |
| | Mol ratio of diisocyanate/diol = 1/1.10, Mw = 15,000, A.V. = 70 mg KOH/g | | | |
| (4) | OCN—C6H4—CH2—C6H4—NCO | 0.50 mol | HOCH2—C(CH3)(COOH)—CH2OH | 0.63 mol |
| | 2,4-TDI | 0.50 mol | HO—(CH2)6—OH | 0.37 mol |
| | | | KF-6001 (Shin-Etsu Chemical, OH value = 62 mg KOH/g) (diol having a polysiloxane moiety at the main chain) | 0.05 mol |
| | Mol ratio of diisocyanate/diol = 1/1.0, Mw = 20,000, A.V. = 81 mg KOH/g | | | |
| (5) | OCN—C6H4—CH2—C6H4—NCO | 1.00 mol | HOCH2—C(CH3)(COOH)—CH2OH | 0.67 mol |
| | | | HO—CH2—C6H4—CH2—OH | 0.31 mol |
| | | | KF-6001 (Shin-Etsu Chemical, OH value = 62 mg KOH/g) (diol having a polysiloxane moiety at the main chain) | 0.05 mol |
| | Mol ratio of diisocyanate/diol = 1/1.03, Mw = 28,000, A.V. = 86 mg KOH/g | | | |
| (6) | OCN—C6H4—CH2—C6H4—NCO | 0.80 mol | HOCH2—C(CH2CH3)(COOH)—CH2OH | 0.60 mol |
| | 2,4-TDI | 0.20 mol | HO—CH2—C6H4—CH2—OH | 0.40 mol |

TABLE 1-continued

| No. | Diisocyanates | mol ratio | Diols | mol ratio |
|---|---|---|---|---|
| | | | KF-6001<br>(Shin-Etsu Chemical, OH value = 62 mg KOH/g)<br>(diol having a polysiloxane moiety at the main chain) | 0.05 mol |
| | Mol ratio of diisocyanate/diol = 1/1.05, Mw = 22,000, A.V. = 81 mg KOH/g | | | |
| (7) | 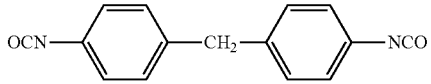 OCN—⟨C₆H₄⟩—CH₂—⟨C₆H₄⟩—NCO | 0.80 mol | 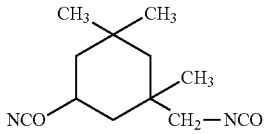 HOCH₂—C(CH₃)(COOH)—CH₂OH | 0.70 mol |
| | 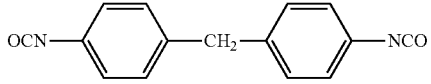 (isophorone diisocyanate) | 0.20 mol | HO—(CH₂)₆—OH | 0.30 mol |
| | | | ICF-8012<br>(Shin-Etsu Chemical, Amino group equivalent<br>weight = 2,200 g/mol)<br>(diamine having a polysiloxane moiety at the main chain) | 0.05 mol |
| | Mol ratio of diisocyanate/(diol + diamine) = 1/1.05, Mw = 22,000, A.V. = 85 mg KOH/g | | | |
| (8) | 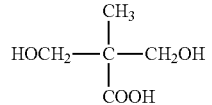 OCN—⟨C₆H₄⟩—CH₂—⟨C₆H₄⟩—NCO | 1.00 mol | 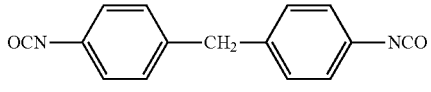 HOCH₂—C(CH₃)(COOH)—CH₂OH | 0.84 mol |
| | | | KF-6002<br>(Shin-Etsu Chemical, OH value = 35 mg KOH/g)<br>(diol having a polysiloxane moiety at the main chain) | 0.05 mol |
| | Mol ratio of diisocyanate/diol = 1/0.9, Mw = 14,000, A.V. = 85 mg KOH/g | | | |
| (9) | 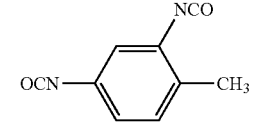 OCN—⟨C₆H₄⟩—CH₂—⟨C₆H₄⟩—NCO | 0.50 mol | 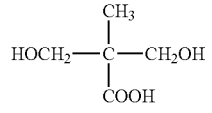 HOCH₂—C(CH₃)(COOH)—CH₂OH | 0.60 mol |
| | 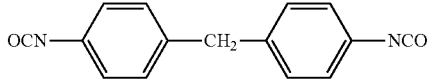 (2,4-tolylene diisocyanate) | 0.50 mol | HO—CH₂—⟨C₆H₄⟩—CH₂—OH | 0.40 mol |
| | | | KF-8010<br>(Shin-Etsu Chemical, Amino group equivalent<br>weight = 430 g/mol)<br>(diamine having a polysiloxane moiety at the main chain) | 0.05 mol |
| | Mol ratio of diisocyanate/(diol + diamine) = 1/1.05, Mw = 22,000, A.V. = 86 mg KOH/g | | | |
| (10) | 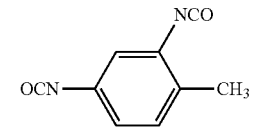 OCN—⟨C₆H₄⟩—CH₂—⟨C₆H₄⟩—NCO | 0.80 mol | 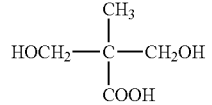 HOCH₂—C(CH₃)(COOH)—CH₂OH | 0.75 mol |
| | 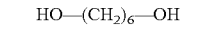 (2,4-tolylene diisocyanate) | 0.20 mol | HO—(CH₂)₆—OH | 0.30 mol |
| | | | KF-8012<br>(Shin-Etsu Chemical, Amino group equivalent<br>weight = 2200 g/mol)<br>(diamine having a polysiloxane moiety at the main chain) | 0.03 mol |
| | Mol ratio of diisocyanate/(diol + diamine) = 1/1.08, Mw = 25,000, A.V. = 84 mg KOH/g | | | |

TABLE 1-continued

| No. | Diisocyanates | mol ratio | Diols | mol ratio |
|---|---|---|---|---|
| (11) | OCN—C6H4—CH2—C6H4—NCO | 0.80 mol | HOCH2—C(CH3)(COOH)—CH2OH | 0.69 mol |
| | 2,4-tolylene diisocyanate (OCN—C6H3(CH3)—NCO with NCO at 2-position) | 0.20 mol | HOCH2—C(CH3)2—CH2OH | 0.20 mol |
| | | | H2N—(CH2)6—NH2 | 0.11 mol |
| | | | KF-6001 (Shin-Etsu Chemical, OH value = 62 mg KOH/g) (diol having a polysiloxane moiety at the main chain) | 0.05 mol |
| | Mol ratio of diisocyanate/(diol + diamine) = 1/1.05, Mw = 21,000, A.V. = 85 mg KOH/g | | | |
| (12) | OCN—C6H4—CH2—C6H4—NCO | 0.80 mol | HOCH2—C(CH3)(COOH)—CH2OH | 0.76 mol |
| | 2,4-tolylene diisocyanate | 0.20 mol | HO—(CH2)6—OH | 0.24 mol |
| | | | X22-176DX (Shin-Etsu Chemical, OH value = 35 mg KOH/g) (diol having a polysiloxane moiety at the side chain) | 0.05 mol |
| | Mol ratio of diisocyanate/diol = 1/1.05, Mw = 21,000, A.V. = 81 mg KOH/g | | | |
| (13) | OCN—C6H4—CH2—C6H4—NCO | 0.80 mol | HOCH2—C(CH3)(COOH)—CH2OH | 0.55 mol |
| | 2,4-tolylene diisocyanate | 0.20 mol | HOCH2—C(CH3)2—CH2OH | 0.50 mol |
| | Mol ratio of diisocyanate/diol = 1/1.05, Mw = 21,000, A.V. = 86 mg KOH/g | | | |

Example 1

(Substrate)

The surface of an aluminum sheet was subjected to an electrolytic roughening treatment using 2% hydrochloric acid. The average roughness Ra was 0.5 μm. Furthermore, the aluminum sheet was subjected to an anodizing treatment in an aqueous 2% sulfuric acid solution to form 2.7 g/m² of an oxide film. The anodized aluminum sheet was dipped in an aqueous 2.5% sodium silicate solution at 70° C. for 30 seconds, washed with water and then dried.

(Image Recording Layer)

On the substrate thus obtained, a coating solution 1 for a lower layer shown in Table 2 was coated in a coating weight of 1.4 g/m² using a bar coater, followed by drying at 135° C. for 40 seconds and further cooling to 35° C. Furthermore, a coating solution 1 for an upper layer shown in Table 3 was coated in a coating weight of 0.6 g/m² using a bar coater, followed by drying at 140° C. for 40 seconds and further slow cooling to a temperature of 20 to 26° C. Thus, a lithographic printing plate precursor was obtained.

TABLE 2

| Coating solution 1 for a lower layer | |
|---|---|
| Components | Amount |
| N-phenymaleimide/methacrylic acid/methacrylamide copolymer Weight ratio: 59/15/26, Mw: 50,000 | 5.21 g |
| Infrared absorbing dye of the following Chemical Formula 3 | 0.94 g |
| Crystal Violet (manufactured by HODOGAYA CHEMICAL Co., Ltd.) | 0.08 g |
| BYK307 (BYK Chemie) | 0.03 g |
| Methyl ethyl ketone | 60.00 g |
| Propylene glycol monomethyl ether | 15.00 g |
| γ-butyrolactone | 9.40 g |
| Water | 9.34 g |

<Chemical formula 3>

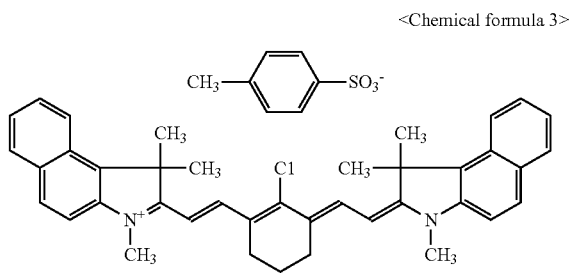

TABLE 3

| Coating solution 1 for an upper layer | |
|---|---|
| Components | Amount |
| Polyurethane (1) of Synthesis Example 1 | 7.50 g |
| Ethyl Violet | 0.03 g |
| Fluorine-based surfactant (30% methyl ethyl ketone solution) | 0.05 g |
| 3-pentanone | 40.00 g |
| Propylene glycol monomethyl ether | 22.50 g |
| Propylene glycol 1-monomethylether 2-acetate | 7.42 g |

Examples 2 to 12

In the same manner as in Example 1, except that the polyurethanes (2) to (12) obtained in Synthesis Examples 2 to 12 were used in place of the polyurethane (1), lithographic printing plate precursors were obtained.

Example 13

In the same manner as in Example 1, except that a coating solution 2 for an upper layer shown in Table 4 was used in place of the coating solution 1 for an upper layer, a lithographic printing plate precursor was obtained.

TABLE 4

| Coating solution 2 for an upper layer | |
|---|---|
| Components | Amount |
| Polyurethane (5) of Synthesis Example 5 | 3.75 g |
| Polyurethane (13) of Synthesis Example 13 | 3.75 g |
| Ethyl Violet | 0.03 g |
| Fluorine-based surfactant (30% methyl ethyl ketone solution) | 0.05 g |
| 3-pentanone | 40.00 g |
| Propylene glycol monomethyl ether | 22.50 g |
| Propylene glycol 1-monomethylether 2-acetate | 7.42 g |

Example 14

In the same manner as in Example 1, except that a coating solution 3 for an upper layer shown in Table 5 was used in place of the coating solution 1 for an upper layer, a lithographic printing plate precursor was obtained.

TABLE 5

| Coating solution 3 for an upper layer | |
|---|---|
| Components | Amount |
| Polyurethane (1) of Synthesis Example 1 | 7.50 g |
| Infrared absorbing dye of Chemical Formula 3 | 0.15 g |
| Ethyl Violet | 0.03 g |
| Fluorine-based surfactant (30% methyl ethyl ketone solution) | 0.05 g |
| 3-pentanone | 62.40 g |
| Propylene glycol 1-monomethylether 2-acetate | 7.37 g |

Examples 15 to 16

In the same manner as in Example 14, except that the polyurethane (2) or (3) obtained in Synthesis Examples 2 or 3 was used in place of the polyurethane (1), lithographic printing plate precursors were obtained.

Comparative Example 1

In the same manner as in Example 1, except that the polyurethane (13) obtained in Synthesis Examples 13 was used in place of the polyurethane (1), a lithographic printing plate precursor was obtained.

Comparative Example 2

In the same manner as in Example 1, except that a coating solution 4 for an upper layer shown in Table 6 was used in place of the coating solution 1 for an upper layer, a lithographic printing plate precursor was obtained.

TABLE 6

| Coating solution 4 for an upper layer | |
|---|---|
| Components | Amount |
| m,p-cresol novolak resin (m/p = 6/4, Mw = 3,500) | 8.00 g |
| Ethyl Violet | 0.03 g |
| Fluorine-based surfactant (30% methyl ethyl ketone solution) | 0.05 g |
| Propylene glycol monomethyl ether | 91.95 g |

Comparative Example 3

In the same manner as in Example 1, except that no upper layer was formed, a lithographic printing plate precursor was obtained.

(Evaluation of Lithographic Printing Plate Precursor)

Using a Magnus 800 plate setter (manufactured by Kodak Japan Ltd.) a thermal exposure apparatus equipped with a laser having a wavelength of 830 nm and an output of 23 W, imagewise exposure of the lithographic printing plate precursors of Examples 1 to 16 and Comparative Examples 1 to 3 was conducted at an exposure rate of 120 mj/cm$^2$. Each of the exposed lithographic printing plate precursors was developed with a water-diluted developing solution SWD1 (manufactured by Kodak Japan Ltd.) for CTP plates using CTP Processor P-940X (manufactured by Kodak Japan Ltd.). The development was conducted under the conditions of 30° C. for 15 seconds. The pH of the diluted developing solution was from 10.0 to 10.7. A finishing gum PF-2 (manufactured by Kodak Japan Ltd.) diluted with water in a volume ratio of 1:1.5 (PF-2:water) was used as a finishing liquid.

(Development Latitude)

A lithographic printing plate precursor was developed with developing solutions each having a different dilution rate (dilution rate=developer (original liquid):water=1:2 to 1:9 (weight ratio) in Table 7). Developing properties of the laser exposed area and the state of the image area were evaluated.

fountain solution Presart WS 100 (DIC Corp.) 1%. The number of papers in which the ink concentration on the paper decreased by 10% was counted as "pieces".

Evaluation results of development latitude, scratch resistance, ink roll up and printing durability are shown in Table 7.

TABLE 7

|  | Resin of upper layer | Development latitude | Scratch resistance (g) | Initial ink receptivity (sheets) | Printing durability (pieces) |
| --- | --- | --- | --- | --- | --- |
| Example 1 | Polyurethane 1 | 1:4-1:7 | 6 | 5 | 180,000 |
| Example 2 | Polyurethane 2 | 1:4.5-1:7.5 | 6 | 4 | 185,000 |
| Example 3 | Polyurethane 3 | 1:3.5-1:6.5 | 5 | 5 | 180,000 |
| Example 4 | Polyurethane 4 | 1:5-1:8 | 6 | 4 | 175,000 |
| Example 5 | Polyurethane 5 | 1:3.5:-1:6.5 | 7 | 4 | 195,000 |
| Example 6 | Polyurethane 6 | 1:4-1:7 | 6 | 4 | 180,000 |
| Example 7 | Polyurethane 7 | 1:4.5-1:7.5 | 6 | 4 | 180,000 |
| Example 8 | Polyurethane 8 | 1:5.5-1:8.5 | 6 | 5 | 165,000 |
| Example 9 | Polyurethane 9 | 1:4.5-1:7.5 | 5 | 5 | 180,000 |
| Example 10 | Polyurethane 10 | 1:4-1:7 | 5 | 5 | 185,000 |
| Example 11 | Polyurethane 11 | 1:3.5-1:6.5 | 6 | 5 | 180,000 |
| Example 12 | Polyurethane 12 | 1:4.5-1:7.5 | 5 | 5 | 180,000 |
| Example 13 | Polyurethane 5 and Polyurethane 13 | 1:4.5-1:7.5 | 5 | 4 | 185,000 |
| Example 14 | Polyurethane 1 | 1:3.5-1:6.5 | 7 | 4 | 185,000 |
| Example 15 | Polyurethane 2 | 1:4-1:7 | 7 | 4 | 190,000 |
| Example 16 | Polyurethane 3 | 1:3-1:6 | 6 | 4 | 185,000 |
| Comparative Example 1 | Polyurethane 13 | 1:4-1:6.5 | 4 | 10 | 175,000 |
| Comparative Example 2 | Novolak | (1:3-1:4)* | — | — | — |
| Comparative Example 3 | None | Only 1:8 | 1 | >100 | 110,000 |

*Insoluble in developing solution, so it couldn't be evaluated.

Development latitude was evaluated by the range of the dilution range which exhibits good image properties. Optimum dilution rate of the developing solution is present in the center of the development latitude width.

(Scratch Resistance)

While applying a load using a scratching testing machine equipped with a sapphire needle having a diameter of 1.0 mm, the surface of a lithographic printing plate precursor was scratched. After the plate was developed with an optimum developing solution having a dilution rate (for example, 1:5:5 for Example 1) in the center of the dilution range which exhibits good image properties determined by "Development latitude", a maximum load value at which no scratch was formed at the scratching portion was determined.

(Initial Ink Receptivity)

A lithographic printing plate precursor was developed with an optimum developing solution having a dilution rate in the center of the dilution range which exhibits good image properties determined by "Development latitude". The lithographic printing plate thus obtained was mounted to a printing press Roland R-201 and then initial ink receptivity was evaluated by using Ink Fusion G Red N type (DIC Corp.) and a fountain solution Presart WS100 (DIC Corp.) 1%. The number of papers in which the ink concentration on the paper was stable was counted as "sheets".

(Printing Durability)

A lithographic printing plate precursor was developed with an optimum developing solution having a dilution rate in the center of the dilution range which exhibits good image properties determined by "Development latitude". The lithographic printing plate thus obtained was mounted to a printing press Roland R-201 and then printing durability was evaluated by using Ink Fusion G Red N type (DIC Corp.) and a As is apparent from the results shown in Table 7, the lithographic printing plate precursors of Examples 1 to 16 exhibit good developing properties (broad development latitude) using a developing solution having a pH of 11 or lower and also have good scratch resistance, good initial ink receptivity and high durability, as compared with the lithographic printing plate precursors of Comparative Examples 1 to 3.

The invention claimed is:

1. A positive working lithographic printing plate precursor, comprising:
   (1) a substrate; and
   (2) an imaging layer, formed on the substrate, comprising a water-insoluble and an alkaline aqueous solution-soluble or dispersible resin and a photo-thermal converting material,
   wherein
   the imaging layer comprises either polyurethane or polyurethane urea or both of the polyurethane and the polyurethane urea, the polyurethane and the polyurethane urea comprising a unit having a substituent having an acidic hydrogen atom and a unit having a polysiloxane moiety in a side or main chain.

2. A positive working lithographic printing plate precursor, comprising:
   (1) a substrate;
   (2) a bottom layer formed on the substrate; and
   (3) a top layer formed on the bottom layer,
   wherein
   the (2) bottom layer and the (3) top layer comprise a water-insoluble and alkaline aqueous solution-soluble or dispersible resin;
   either of the (2) bottom layer or the (3) top layer or both of the (2) bottom layer and the (3) top layer comprise(s) a photo-thermal converting material; and the top layer (3) comprises either polyurethane or polyurethane urea or both of the polyurethane and the polyurethane urea, the polyurethane and the polyurethane urea comprising a unit having a substituent having an acidic hydrogen atom and a unit having a polysiloxane moiety in a side or main chain.

3. The positive working lithographic printing plate precursor according to claim 1, wherein the polyurethane is obtainable from the reaction of
at least one diisocyanate component, and
a diol component comprising a diol comprising a substituent having an acidic hydrogen atom and a diol having a polysiloxane moiety in a side or main chain.

4. The positive working lithographic printing plate precursor according to claim 1, wherein the polyurethane urea is obtainable from the reaction of:
at least one diisocyanate component,
a diol component comprising either a diol comprising a substituent having an acidic hydrogen atom, a diol having a polysiloxane moiety in a side or main chain, or a diol comprising both a substituent having an acidic hydrogen atom and a polysiloxane moiety in a side or main chain, and
at least one diamine component.

5. The positive working lithographic printing plate precursor according to claim 4, wherein the at least one diamine component is a diamine having a polysiloxane moiety in a main chain.

6. The positive working lithographic printing plate precursor according to claim 1, wherein the substituent having an acidic hydrogen atom is selected from the group consisting of a carboxy group, —SO$_2$NHCOO—, —CONHSO$_2$—, —CONHSO$_2$NH—, and —NHCONHSO$_2$—.

7. The positive working lithographic printing plate precursor according to claim 3, wherein the dial having a polysiloxane moiety in a side or main chain has no silicon atom-bonded hydroxy group.

8. The positive working lithographic printing plate precursor according to claim 3, wherein the diol having a polysiloxane moiety in a main chain is a both terminal hydroxy-modified diorganopolysiloxane which has at both terminals a group represented by the formula:

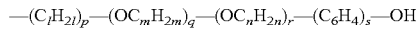
—(C$_l$H$_{2l}$)$_p$—(OC$_m$H$_{2m}$)$_q$—(OC$_n$H$_{2n}$)$_r$—(C$_6$H$_4$)$_s$—OH wherein
l, m and n each independently denotes an integer from 1 to 3,
p is an integer of 1 or more,
q is an integer of from 0 to 100,
r is an integer of from 0 to 100, and
s is an integer of from 0 to 3.

9. The positive working lithographic printing plate precursor according to claim 3, wherein the diol having a polysiloxane moiety in a side chain is a one terminal diol-modified diorganopolysiloxane represented by the formula:

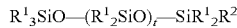
R$^1_3$SiO—(R$^1_2$SiO)$_t$—SiR$^1_2$R$^2$ wherein
R$^1$ independently denotes a C$_1$-C$_{20}$ alkyl group, a C$_6$-C$_{20}$ aryl group or a C$_7$-C$_{20}$ aralkyl group;
R$^2$ denotes —(C$_l$H$_{2l}$)$_u$—(OC$_m$H$_{2m}$)$_v$—(OC$_n$H$_{2n}$)$_w$—(C$_6$H$_4$)$_x$—CR$^1$R$^3_2$
wherein
l, m, n and R$^1$ are as defined above,
u is an integer of 1 or more,
v is an integer of from 0 to 100,
w is an integer of from 0 to 100,
x is an integer from 0 to 3, and
R$^3$ independently denotes —(C$_y$H$_{2y}$)$_z$OH where y is an integer of from 1 to 3 and z is an integer of from 1 to 100; and
t is an integer of from 1 to 10,000.

10. The positive working lithographic printing plate precursor according to claim 1, wherein the amount in the imaging layer of either polyurethane or polyurethane urea or both of the polyurethane and the polyurethane urea is from 10 to 99% by weight relative to the total weight of the imaging layer.

11. The positive working lithographic printing plate precursor according to claim 2, wherein the amount in the (3) top layer of either polyurethane or polyurethane urea or both of the polyurethane and the polyurethane urea is from 10 to 99% by weight relative to the total weight of the (3) top layer.

12. A process for preparing a lithographic printing plate, comprising the steps of:
imagewise exposing the positive working lithographic printing plate precursor according to claim 1; and
developing the exposed positive working lithographic printing plate precursor with an alkaline developer to remove exposed regions in order to form imaging and non-imaging regions.

13. The process for preparing a lithographic printing plate according to claim 12, wherein the step of imagewise exposing is performed by using an IR laser.

14. The process for preparing a lithographic printing plate according to claim 12, wherein the alkaline developer has a pH of 12 or less.

15. The positive working lithographic printing plate precursor according to claim 2, wherein the polyurethane is obtainable from the reaction of
at least one diisocyanate component, and
a diol component comprising a diol comprising a substituent having an acidic hydrogen atom and a diol having a polysiloxane moiety in a side or main chain.

16. A process for preparing a lithographic printing plate, comprising the steps of:
imagewise exposing the positive working lithographic printing plate precursor according to claim 2; and
developing the exposed positive working lithographic printing plate precursor with an alkaline developer to remove exposed regions in order to form imaging and non-imaging regions.

* * * * *